(12) United States Patent
Bextermoeller et al.

(10) Patent No.: US 9,948,295 B2
(45) Date of Patent: Apr. 17, 2018

(54) SENSOR DEVICE FOR A MOTOR VEHICLE

(71) Applicant: HUF HÜLSBECK & FÜRST GMBH & CO. KG, Velbert (DE)

(72) Inventors: Hubert Bextermoeller, Muelheim a.d.R. (DE); Peter Van Gastel, Solingen (DE); Andreas Peschl, Velbert (DE)

(73) Assignee: Huf Huelsbeck & Fuerst GmbH & Co. KG, Velbert (DE)

( * ) Notice: Subject to any disclaimer, the term of this patent is extended or adjusted under 35 U.S.C. 154(b) by 0 days.

(21) Appl. No.: 15/313,771

(22) PCT Filed: May 7, 2015

(86) PCT No.: PCT/EP2015/060097
§ 371 (c)(1),
(2) Date: Nov. 23, 2016

(87) PCT Pub. No.: WO2015/180942
PCT Pub. Date: Dec. 3, 2015

(65) Prior Publication Data
US 2017/0194960 A1 Jul. 6, 2017

(30) Foreign Application Priority Data

May 28, 2014 (DE) .......... 10 2014 107 559

(51) Int. Cl.
*H03K 17/955* (2006.01)
*E05B 81/76* (2014.01)
(Continued)

(52) U.S. Cl.
CPC .......... *H03K 17/955* (2013.01); *E05B 81/76* (2013.01); *G01R 27/2605* (2013.01);
(Continued)

(58) Field of Classification Search
CPC ......... H03K 17/955; H03K 2217/9607; H03K 2017/9604; H03K 17/962; G07C 2209/65;
(Continued)

(56) References Cited

U.S. PATENT DOCUMENTS

2010/0305816 A1* 12/2010 Orlewski .......... B60R 21/01516
701/45
2013/0311039 A1* 11/2013 Washeleski ............. E05F 15/40
701/36

FOREIGN PATENT DOCUMENTS

DE           196 17 038 A1   11/1997
DE     10 2005 055 888 A1   11/2007
(Continued)

OTHER PUBLICATIONS

International Preliminary Report on Patentability of International Application No. PCT/EP2015/060097 dated Nov. 29, 2016, 13 pages (including English translation).
(Continued)

*Primary Examiner* — Melissa Koval
*Assistant Examiner* — Trung Nguyen
(74) *Attorney, Agent, or Firm* — Fay Sharpe LLP

(57) ABSTRACT

A sensor device for a motor vehicle includes a multi-layer circuit board on which a plurality of metallized planes are formed. A capacitive sensor electrode is formed on one of the planes for detection by capacitive approachment sensing. A control device controls the sensor electrode as a capacitive sensor electrode in order to detect approaches of a user towards the sensor electrode via an evaluation device. At least one planar electrode region is formed on each of the metallized planes, wherein each of the electrode regions is coupled to the control device. At least two of the electrode regions on different metallized planes are activated and evaluated as sensor electrodes and at least two of the (Continued)

electrode regions on different planes are activated and evaluated as the ground in a temporally offset manner.

10 Claims, 1 Drawing Sheet

(51) Int. Cl.
G01R 27/26 (2006.01)
H03K 17/96 (2006.01)
G07C 9/00 (2006.01)
H05K 1/16 (2006.01)
(52) U.S. Cl.
CPC ....... *G07C 9/00309* (2013.01); *H03K 17/962* (2013.01); *H05K 1/162* (2013.01); *G07C 2209/65* (2013.01); *H03K 2017/9604* (2013.01); *H03K 2217/9607* (2013.01)
(58) Field of Classification Search
CPC ................ G07C 9/00309; H05K 1/162; G01R 27/2605; E05B 81/76
USPC ...... 324/200, 679, 609, 207.13–207.22, 219, 324/239–242, 500, 521, 529, 750.06, 600, 324/686; 701/36
See application file for complete search history.

(56) References Cited

FOREIGN PATENT DOCUMENTS

| | | |
|---|---|---|
| DE | 10 2009 002 566 A1 | 10/2010 |
| DE | 10 2012 109 034 A1 | 3/2014 |
| EP | 2 243 906 A2 | 10/2010 |
| EP | 2 568 605 A1 | 3/2013 |
| FR | 2 942 637 A1 | 9/2010 |

OTHER PUBLICATIONS

International Search Report of International Application No. PCT/EP2015/060097 dated Jul. 28, 2015, 4 pages.

* cited by examiner

SENSOR DEVICE FOR A MOTOR VEHICLE

BACKGROUND

The invention relates to a sensor device for a motor vehicle, in particular a sensor device for capacitive detection of approaches of a user to the vehicle.

The sensor device is designed with at least one multi-layer printed circuit board, having numerous metallized planes. A capacitive sensor electrode is formed for detecting purposes on one of the metallized planes. A control device is coupled to the sensor electrode, in order to apply an electric voltage in relation to a reference potential to the sensor electrode. An evaluation device detects capacitance changes at the sensor electrode, in order to detect the approaches of a user to the sensor electrode. The control device and evaluation device can be integrated thereby to form a single device.

Capacitive detection systems for approaches are known in technology. A capacitance is formed between the sensor electrode, which is brought to a predefined potential, and a reference electrode, e.g. the vehicle ground or the ground of the substrate located under the vehicle. This capacitance can vary when a body moves within the sensing range of the sensor assembly, e.g. the foot of a user. The detection of the capacitance itself can be accomplished in a variety of ways. By way of example, a number of clocked discharge sequences, or a discharge time period may be used as a measurement value for the capacitance. By way of example, a capacitive detection of an approach to a vehicle door handle is also known from DE 196 17 038 A1.

DE 10 2012 109 034 A1 discloses, by way of example, a vehicle door handle having an integrated sensor assembly. The sensor assembly uses a multi-layer printed circuit board having a sensor electrode, which is formed by numerous conductor structures in adjacent printed circuit board planes having interlayer connections.

The concept of capacitive approach detection using a sensor electrode, a shielding electrode (also known as a directing electrode) and a reference electrode is likewise known in technology. By way of example, a concept of this type is disclosed in EP 2 568 605. DE 10 2009 002 566 A1 also discloses a sensor assembly having various metallized planes and a sensor electrode as well as a shielding electrode.

Sensor electronics of the specified type are used, for example, to detect the proximity of a hand of the user of a vehicle to the door handle or hatch of a vehicle. If such an approach is detected, e.g., a radio signal dialog is triggered with an access key for the vehicle from a vehicle-side electronics system.

As can be derived from the prior art and the aforementioned documents, the sensor electrode is aimed at the detection area. A shielding electrode is placed on the side facing away from the detection area, wherein the shielding electrode tracks the sensor electrode in terms of its potential, or is varied in relation to the potential thereof. However, the capacitance changes to the sensor electrode are evaluated, not those of the shielding electrode. A ground electrode may be placed behind the shielding electrode, to serve as a reference potential for the capacitance detection.

Modern vehicles and operating systems require increasingly more complex and also more flexible operating possibilities.

The object of the invention is therefore to provide an improved sensor assembly for a capacitive approach detection.

BRIEF SUMMARY

This objective is achieved by a sensor device having the features of claim 1.

One essential feature of the invention is the use of a multi-layer printed circuit board having numerous metallized planes, which accommodates electrode regions in various planes. Any printed circuit board having numerous metallized planes can be regarded as a multi-layer printed circuit board. By way of example, it may be formed by a single printed circuit board having a metallized front and back surface. More than two metallized planes may also be used within the framework of the invention. A multi-layer printed circuit board may also be a composite of numerous individual printed circuit boards in this context, which are combined to form a multi-layer assembly, e.g. via a press-fit procedure.

These electrode regions are not, however, provided with a rigid functionality. Different electrode regions can be activated in an alternating manner, such that they fulfill different functions at different times. In a type of temporal multiplex operation, an electrode region can thus serve as a sensor electrode for a period of time, and as a ground electrode in another time period and detection schematic, or it can be used as a shielding electrode. The device according to the invention has numerous electrode regions, which may be located in part in an overlapping manner in various planes, and in this manner, implement different operating modes with a temporal multiplex activation thereof.

The important thing is that at least one planar electrode region is formed on numerous ones of the metallized planes, respectively. Each of the electrode regions used for the invention is coupled to an electronic control device, which can provide the electrode regions with different voltages.

An evaluation device is coupled to at least a selection of the electrode regions, in order to detect capacitance changes. The evaluation device and control device are coupled to one another in order to synchronize the change between the detection schematics and the activations of the electrode regions. They can also be designed in an integrated manner, such that one circuit implements the activation and the evaluation. Different voltages are applied to a selection of the electrode regions, and the evaluation device evaluates various electrode regions functioning as sensor electrodes, depending on the current activation/evaluation schematic.

With the device according to the invention, it is not necessary to implement numerous sensor devices in order to detect different operating concepts. These operating concepts are implemented with a multi-functional electrode assembly on a multi-layer printed circuit board. Galvanically separated regions may be formed thereby in one plane for activation, in order to detect, for example, actuations in a handle region, as a function of the actuation point along the handle axis. Furthermore, the directions of detection, starting from the printed circuit board, can be modified and reversed. This is possible in that, by way of example, the positions of the sensor electrode and the shielding electrode, as well as the ground electrode, are interchanged. If such a multi-layer printed circuit board is thus disposed for example in a vehicle door handle, then the printed circuit board can be oriented, on one hand, such that its cover side faces the inside of the door handle, and on the other hand, is in the viewing direction of the outside of the door handle. By exchanging the functional planes of the metallized regions, the detection area can, on one hand, be directed toward the inside of the door handle, and also, in a temporal multiplex process, temporarily toward the outside of the door handle. By way of example, both the opening desire of the user when grasping the inside of the door with the hand, as well as the closing desire of the user, e.g. when the hand is placed on the outside of the handle, can be detected therewith.

In a simple design, one printed circuit board has two metallized planes, the function thereof, as a sensor electrode and ground electrode, can be exchanged in a temporal sequence, in order to reverse the detection direction. Another simple design uses three metallized planes, the middle of which is retained as a shielding electrode, while the outer electrodes exchange functions, as a sensor electrode and ground electrode, in a temporal exchange. It shall become clear below that a larger number of metallized planes may also be used.

In a further development of the invention, as indicated above, not only are metallized regions in different planes of the multi-layer printed circuit board designed to function as electrode regions for a capacitive sensor, but also, numerous separated electrode regions are formed in a single plane, which can be activated individually, or evaluated individually.

Fundamentally, a particularly good sensing is possible, when an electrode functioning as a sensor, or a sensor electrode composite, formed by numerous electrode surfaces, is shielded by a shielding electrode over as much of its surface area as possible, and this shielding is protected with a ground electrode. Accordingly, the numerous electrode regions of each plane could form sensor electrodes, shielding electrodes or ground electrodes of this type through interconnecting them.

In such a design, a detection area may be provided, for example, which performs a detection for the targeted actuation through placing a thumb or finger on a section of the handle.

Such separated sensor electrodes in a plane could be activated together in another sequence, as mentioned above, in order to form a collective ground electrode or shielding electrode.

All of these different detection schematics, having the alternating electrode functions, can be executed cyclically in a temporal sequence. However, a temporal activation can also occur, such that the functions of the electrode regions are selected depending on the state of the vehicle. If, for example, the vehicle is unlocked, the sensors and the electrode regions are activated such that only a relocking function is detected. On the other hand, an unlocking sensing is switched to if the vehicle is in the locked state.

It is entirely possible within the framework of the invention to combine numerous electrode regions on different planes to form functional units, in order, for example, to provide them with the same functionality in a time period, and to also apply the same voltage to them.

By way of example, a shielding electrode can be expanded over numerous planes of the multi-layer printed circuit board in this manner, and basically encompass or enclose a sensor electrode in this manner.

BRIEF DESCRIPTION OF THE DRAWINGS

The invention shall now be explained in greater detail based on the attached drawings.

DETAILED DESCRIPTION

Figure 1:
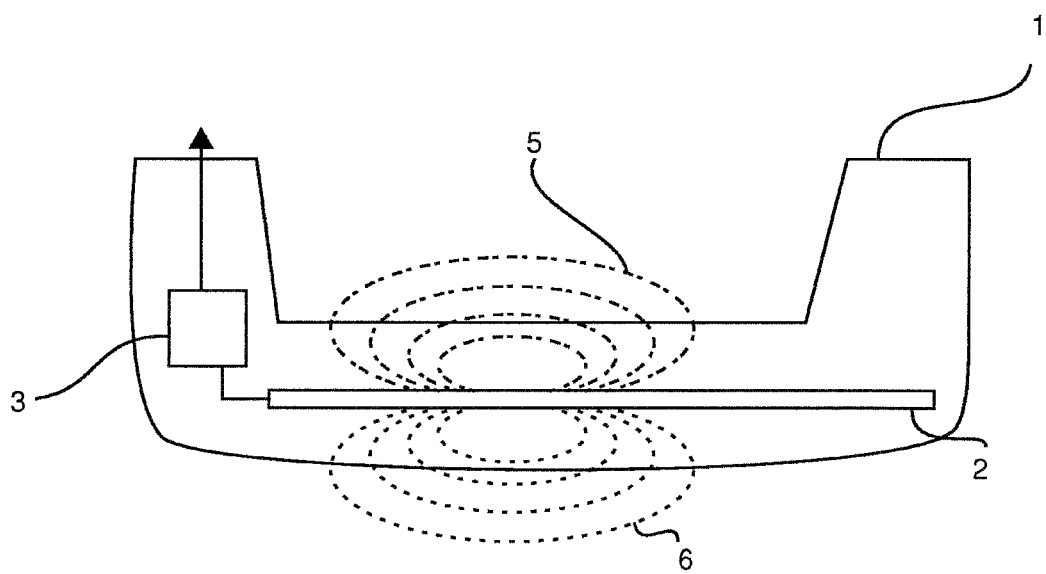
FIG. 1 illustrates a stylized door handle for a motor vehicle which is equipped with a sensor assembly according to the invention.

FIG. 1 shows a stylized door handle 1 for a motor vehicle, which is equipped with the sensor assembly according to the invention. A multi-layer printed circuit board 2 is disposed in the door handle assembly in the handle part, i.e. the area that is to be grasped when opening the door. Numerous planes having sensor electrode regions are formed on the multi-layer printed circuit board 2, as shall be described below. A control and evaluation device 3 is coupled to the printed circuit board 2, and the electrode regions disposed thereon. The control and evaluation device 3 is connected to the vehicle-side central control unit via a wiring harness.

The active principle is depicted in FIG. 1, according to which different sensor functions and detection areas are obtained with one and the same multi-layer printed circuit board 2 and also the same electrode regions. When the sensor electrodes are connected by means of the control and evaluation device 3 in accordance with a first schematic, a detection area 5 is obtained, the field line region of which is indicated in FIG. 1 with a first broken-lined illustration. If a user grasps in this region on the inside of the door handle, this is detected by the sensor electrode assembly, and a corresponding vehicle function can be triggered. If the control and evaluation device 3 is connected in the sensor electrodes on the multi-layer printed circuit board 2 in accordance with a second schematic, then a field line curve 6 is obtained by the sensor electrodes, which is illustrated by a second type of broken line. The field line curves 5 and 6 are thus offset temporally, and not obtained simultaneously.

Figure 2:
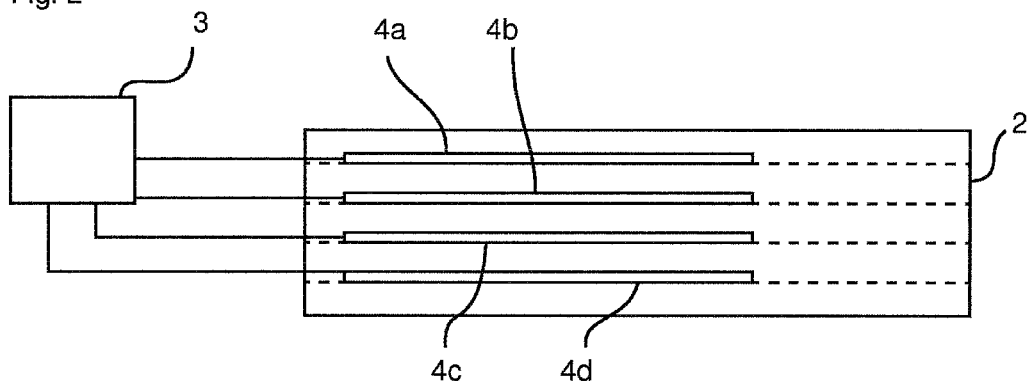
FIG. 2 is an enlarged schematic view of a control and evaluation device that is coupled to a multilayer printed circuit board and the electrode regions disposed therein.

FIG. 2 shows, in an enlarged schematic view, the control and evaluation device 3 and the coupling to the multi-layer printed circuit board 2 and the electrode regions disposed therein. Numerous electrode planes are formed in the printed circuit board 2, and numerous metallized electrode regions 4a, 4b, 4c and 4d are disposed therein. In order to obtain the field line formation having a detection area above the printed circuit board depicted in FIG. 2, for example, electrode 4a is activated as a sensor electrode, for example, such that a predefined voltage in comparison with a reference electrode is applied thereto and monitored by the evaluation circuitry. The electrode 4b then functions as a shielding electrode, wherein it is run at the same potential, for example, as the sensor electrode 4a, although capacitance changes are only monitored in the sensor electrode 4a, but not in the shielding electrode 4b. The electrode region 4c is maintained without a potential (floating) in this configuration, and the electrode region 4d is coupled to the ground. In this manner, a direction area directed upward is obtained (area 5 in FIG. 1).

The detection area can be changed such that it is directed downward (area 6 in FIG. 1) in a temporally offset manner, or through rapid switching. In this case, the electrode 4d serves as the sensor electrode, with the associated potential and associated evaluation. Electrode 4c can be maintained without potential in this example, while electrode 4b runs on the same potential as the sensor electrode 4d, as a shielding electrode, but without capacitance monitoring. The electrode 4a can be coupled to the ground potential in accordance with this schematic.

It is apparent that the same electrode regions can assume different electrode functionalities, temporally offset.

Figure 3:
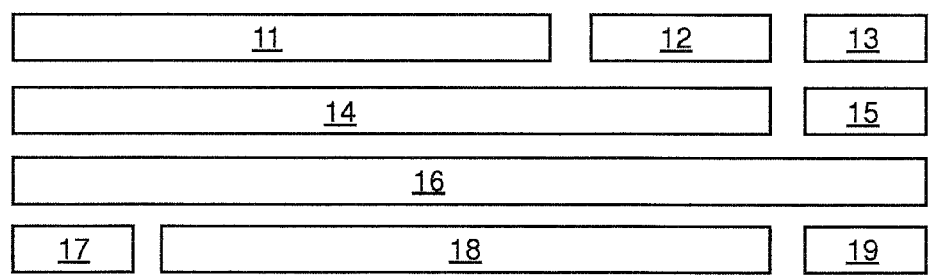
FIG. 3 shows another exemplary embodiment of a multilayer printed circuit board depicted in stylized form.

FIG. 3 shows another exemplary embodiment, in which a layer arrangement on a multi-layer printed circuit board is depicted in a stylized form. An assembly of this type can also be accommodated in an appropriate handle assembly for the hatch or the side doors of a vehicle.

The electrode regions 11 to 19 are formed on four different planes in the multi-layer printed circuit board. These electrode regions are coupled in turn to a control and evaluation device, which is not shown herein.

In accordance with a first function schematic, numerous electrode regions, areas 13, 15 and 16 in this example, are coupled to a shielding voltage, while region 11 is connected as a sensor electrode. The lateral arrangement of the electrode regions 13 and 15, in addition to the electrode region 16, encompasses the action of the sensor electrode 11 in the manner of a frame. Electrode 18 can be connected as a ground electrode in this schematic.

In a second schematic, which is activated at a temporal offset to the schematic described above, the electrodes receive different functions, or other electrode regions are activated. In this other schematic, for example, electrode 14 is provided with a shielding voltage, for example, while electrode 18 acts as a sensor electrode. The electrode regions 17 and 19 are coupled to the same potential as electrode 14, such that the sensor electrode 18 is also encompassed by a shielding voltage potential here, applied to the electrodes 14, 17 and 19. Electrode 16 can remain without potential in this schematic, while, for example, electrode 12 acts as the ground electrode.

In accordance with another, temporally offset, activatable schematic, the electrodes 12, 13, 15, and 19 can be activated in order to monitor a limited area. By way of example, electrode 19 can be placed around the area for the application of a thumb on the handle. If the detection schematic for thumb application detection is then activated, electrode 19 serves as a sensor, electrodes 18 and 16 serve as shielding electrodes, and electrode 15 serves as the ground.

It is visible that in accordance with the invention, different electrode regions on the same plane of a multi-layer printed circuit board as well as on different planes of the printed circuit board can be functionally activated in a temporally modifiable manner. Numerous electrode regions can be combined to form functional units thereby. The important thing is that some of the electrode regions assume different functions in different activation schematics.

The invention claimed is:

1. A sensor device for a motor vehicle, comprising a multi-layer printed circuit board, on which numerous metallized planes are formed, wherein a capacitive sensor electrode is formed on one of the electroplated planes, for detection using capacitive approach detection, wherein a control device is coupled to the sensor electrode, in order to apply an electrical voltage in relation to a reference potential to the sensor electrode, and an evaluation device detects a change in capacitance of the sensor electrode, in order to detect an approach of a user to the sensor electrode, wherein at least one planar electrode region is formed on numerous ones of the metallized planes, respectively, wherein each of the electrode regions is coupled to the control device, such that a dedicated, individual electrical voltage in relation to a reference potential is applied to each of the electrode regions, wherein the evaluation device is coupled to at least two of the electrode regions on different metallized planes, wherein the evaluation device and the control device are designed such that at least two of the electrode regions on different metallized planes are activated and evaluated in a temporally alternating manner as sensor electrodes, and at least two of the electrode regions on different metallized planes are activated and evaluated as the ground, wherein the two electrode regions on different metallized planes, which can be activated in an alternating manner as sensor electrodes and ground electrodes, are identical, such that each of the electrodes can be activated temporarily as a sensor electrode and temporarily as a ground electrode.

2. The sensor device according to claim 1, wherein in at least one metallized plane, two separate electrode regions are formed, which can be activated or evaluated separately.

3. The sensor assembly according to claim 2, wherein the control circuitry is designed such that at least one of the coupled electrode regions can be connected temporarily without potential (floating).

4. The sensor assembly according to claim 2, wherein the control device and the evaluation device are designed such that electrode regions in different planes of the multi-layer printed circuit board are connected in a temporally offset manner as sensor electrodes.

5. The sensor assembly according to claim 1, wherein the control circuitry is designed such that at least one of the coupled electrode regions can be connected temporarily without potential (floating).

6. The sensor assembly according to claim 5, wherein the control device and the evaluation device are designed such that electrode regions in different planes of the multi-layer printed circuit board are connected in a temporally offset manner as sensor electrodes.

7. The sensor assembly according to claim 1, wherein the control device and the evaluation device are designed such that electrode regions in different planes of the multi-layer printed circuit board are connected in a temporally offset manner as sensor electrodes.

8. The sensor assembly according to claim 7, wherein the control device and the evaluation device are designed such that, first, an electrode region is connected as a sensor electrode, the plane of which of the multi-layer printed circuit board has a first spacing to a first outer surface of the multi-layer printed circuit board, and at the same time, another electrode region is connected as a shielding electrode, the plane of which of the multi-layer printed circuit board has a second spacing to the outer surface, wherein the second spacing is greater than the first spacing, and, temporally offset thereto, an electrode region is connected as a sensor electrode, the plane of which of the multi-layer printed circuit board has a third spacing to the first outer surface of the multi-layer printed circuit board, wherein the third spacing is greater than the first spacing, and simultaneously, another electrode region is connected as a shielding electrode, the plane of which of the multi-layer printed circuit board has a fourth spacing to the outer surface, wherein the fourth spacing is smaller than the third spacing, such that, temporally offset, the spatial arrangement of the sensor electrode and shielding electrode is reversed in relation to the outer surface.

9. The sensor assembly according to claim 1, wherein the electrode regions overlap, at least in pairs, and at least in part, in a direction perpendicular to a printed circuit board plane.

10. The sensor assembly according to claim 1, wherein at least one electrode region can be connected in a plane as a sensor electrode, one electrode region in a different plane can be connected as a shielding electrode, and one electrode region in a further, different plane, can be connected as a ground electrode.

* * * * *